(12) United States Patent
Donolo

(10) Patent No.: US 10,298,168 B2
(45) Date of Patent: May 21, 2019

(54) SLIP-DEPENDENT MOTOR MODEL

(71) Applicant: Schweitzer Engineering Laboratories, Inc., Pullman, WA (US)

(72) Inventor: Marcos A. Donolo, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 77 days.

(21) Appl. No.: 15/592,636

(22) Filed: May 11, 2017

(65) Prior Publication Data

US 2018/0013375 A1 Jan. 11, 2018

Related U.S. Application Data

(60) Provisional application No. 62/359,436, filed on Jul. 7, 2016.

(51) Int. Cl.
*H02P 6/20* (2016.01)
*H02P 6/34* (2016.01)
(Continued)

(52) U.S. Cl.
CPC .......... *H02P 29/66* (2016.02); *G06F 17/5009* (2013.01); *G06F 17/5095* (2013.01); *H02P 6/20* (2013.01); *H02P 6/34* (2016.02)

(58) Field of Classification Search
CPC ................................ H02P 29/66; H02P 25/022
(Continued)

(56) References Cited

U.S. PATENT DOCUMENTS 4,218,718 A 8/1980 Sun
4,659,973 A * 4/1987 Stich ...................... H02P 25/03
318/712
(Continued)

FOREIGN PATENT DOCUMENTS

WO 2008116966 10/2008
WO 2011076263 6/2011
WO 2016037711 3/2016

OTHER PUBLICATIONS

Benouzza, N., Benyettou, A., Bendiabdellah, A., An Advanced Park's Vectors Approach for Rotor Cage Diagnosis, IEEE First International Symposium on Control, Communications and Signal Processing, Mar. 21-24, 2004.
(Continued)

*Primary Examiner* — David Luo
(74) *Attorney, Agent, or Firm* — Jared L. Cherry; Richard M. Edge

(57) ABSTRACT

The present disclosure pertains to systems and methods configured to monitor and protect an electric motor during startup using a motor model. The motor model parameters may be calculated using measurements taken during a calibration start of the electric motor. The measurements may include slip, stator current, stator voltage, frequency, and/or other electrical or physical parameters. In some embodiments, the motor model parameters may be calculated by minimizing the difference between a measured slip and a calculated slip. The motor model may comprise a variety of parameters used to determine operation parameters of the motor during the startup. In one specific embodiment, the motor model may determine a thermal capacity used (TCU). The TCU may be compared to a threshold value to determine whether protective action is necessary.

20 Claims, 7 Drawing Sheets

(51) Int. Cl.
*G06F 17/50* (2006.01)
*H02P 29/66* (2016.01)

(58) Field of Classification Search
USPC .......................................... 318/717, 716, 700
See application file for complete search history.

(56) References Cited

U.S. PATENT DOCUMENTS

| | | | |
|---|---|---|---|
| 4,761,703 | A | 8/1988 | Kliman |
| 5,030,917 | A | 7/1991 | Kliman |
| 6,172,509 | B1 | 1/2001 | Cash |
| 6,308,140 | B1 | 10/2001 | Dowling |
| 6,456,946 | B1 | 9/2002 | O'Gorman |
| 6,856,115 | B2 * | 2/2005 | Branecky ............... H02P 23/08 318/432 |
| 7,336,455 | B2 | 2/2008 | Dimino |
| 7,675,720 | B1 * | 3/2010 | Zocholl ............... H02H 7/0816 318/445 |
| 8,106,621 | B2 * | 1/2012 | Sato ....................... H02P 21/09 318/599 |
| 8,725,451 | B2 | 5/2014 | Whitefield |
| 9,151,802 | B2 | 10/2015 | Donolo |
| 9,176,024 | B2 | 11/2015 | Jensen |
| 2007/0035398 | A1 | 2/2007 | Vesel |
| 2010/0301792 | A1 | 12/2010 | Tiwari |
| 2015/0311849 | A1 | 10/2015 | Zhang |

OTHER PUBLICATIONS

Cardoso, A.J.M., and Saraiva E.S., Computer-Aided Detection of Airgap Eccentricity in Operating Three-Phase Induction Motors by Park's Vector Approach, IEEE Transactions on Industry Applications, vol. 29, Issue 5, Sep./Oct. 1993.

Didier, G., Ternisien, E., Caspary, O., Razik H., Fault Detection of Broken Rotor Bars in Induction Motor using a Global Fault Index, IEEE Transactions on Industry Applications, vol. 42, Issue 1, Jan. 30, 2006.

Douglas, H., Pillay, P., Ziarani, A., Detection of Broken Rotor Bars in Induction Motors Using Wavelet Analysis, IEEE International Electric Machines and Drives Conference, Jun. 2003.

Stankovic, Dragen, et al., Enhanced Algorithm for Motor Rotor Broken Bar Detection, IEEE Industrial and Commercial Power Systems Technical Conference, May 9-13, 2010.

Kilman, G.B., et al, Noninvasive Detection of Broken Rotor Bars in Operating Induction Motors, IEEE Transactions on Energy Conversion, vol. 3, No. 4, Dec. 1988.

Cardoso, A.J.M., Cruz, S.M.A., Carvalho, J.F.S., Saraiva, E.S., Rotor Cage Fault Diagnosis in Three-Phase Induction Motors, by Park's Vector Approach, IEEE Industry Applications Conference, Oct. 1999.

Cruz, S.M.A., Cardoso, A.J.M., Stator Winding Fault Diagnosis in Three-Phase Synchronous and Asynchronous Motors, by the Extended Park's Vector Approach, IEEE Transactions on Industry Applications, vol. 37, No. 5, Sep./Oct. 2001.

Williamson, S., and Smith, A.C., Steady-State Analysis of 3-Phase Cage Motors with Rotor-Bar and End-Ring Faults, IEE Proc. vol. 129, Pt.B, No. 3, May 1982.

Borim, Thiago Leite, et al., Benefits of Monitoring the Rotor Electrical Quantities and Transmitting by Wireless Communication, Presented at IEEE 2015 Petroleum and Chemical Industry Conference, Oct. 2015.

Arebi, Lufti, Gu, J., Ball, Andrew and Gu, Fengshou (2010) Investigation of a Rotating Shaft with a Novel Integrated Wireless Accelerometer. In: The Seventh International Conference on Condition Monitoring and Machinery Failure Prevention Technologies, Jun. 22-24, 2010, Ettington Chase, Stratford-upon-Avon, England, UK.

Benbouzid et al., What Stator Current Processing-Based Technique to Use for Induction Motor Rotor Faults Diagnosis?, Jun. 2003, IEEE Transactions on Energy Conversion, vol. 18, No. 2.

Benbouzid et al., A Review of Induction Motors Signature Analysis as a Medium for Faults Detection, Oct. 2000, IEEE Transactions on Industrial Electronics, vol. 47, No. 5.

Didier et al., A New Approach to Detect Broken Rotor Bars in Indcution Machines by Current Spectrum Analysis, Apr. 25, 2006, Mechanical Systems and Signal Processing 21 (2007), p. 1127-1142.

R.L. Nailen, Power Plant Electrical Reference Series, vol. 6, Motors (1987), pp. 128-131.

ABB MACHsense-R—Remote Condition Monitoring Service Installation and Comissioning Manual, 2012.

Resler, Steve: Wireless Sensor Technology Measures Torsional Shaft Vibration in Turbine Generators, Jan. 1, 2016.

* cited by examiner

SLIP-DEPENDENT MOTOR MODEL

RELATED APPLICATIONS

This application claims the benefit under 35 U.S.C. § 119(e) of U.S. Provisional Patent Application No. 62/359,436, filed Jul. 7, 2016, and titled "SLIP DEPENDENT THERMAL MODEL AUTO SET FUNCTION," which is incorporated herein by reference in its entirety.

TECHNICAL FIELD

This disclosure relates to monitoring and protection of electric motors. More particularly, this disclosure relates to protection settings of electric motors using available machine operating parameters.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
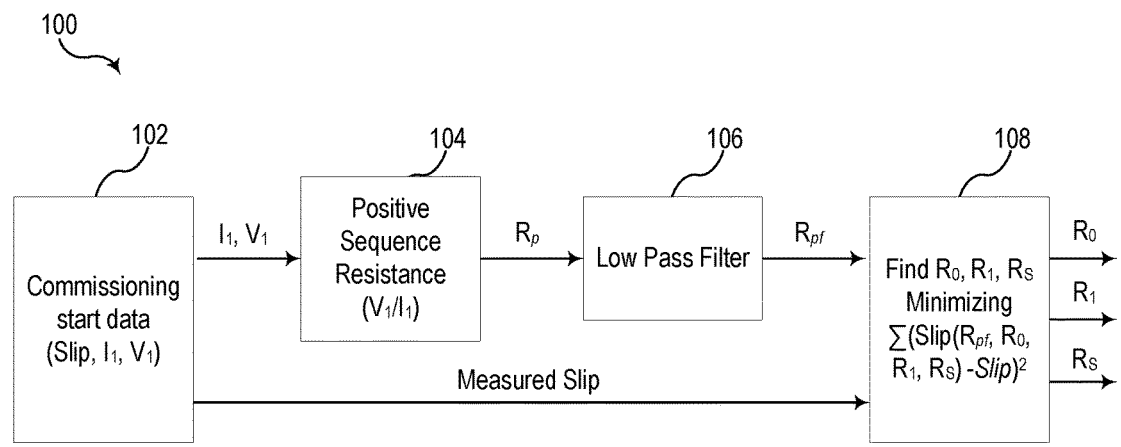
FIG. 1 illustrates a method for determining slip-dependent motor model values consistent with embodiments of the present disclosure.

Slip-dependent motor models enable longer motor start times, which may be needed on high-inertia applications. A slip-dependent motor model may utilize a locked rotor torque (LRQ) value in per unit of the full load torque of the motor, a locked rotor current (LRA) value in per unit of full load current (FLA), and a full load slip (FLS) value of the motor. These values are commonly provided for Induction Motors (IMs); however, these numbers are generally not provided for synchronous motors. The lack of these values can impede the use of a slip-dependent motor model.

In various embodiments consistent with the present disclosure, LRQ, LRA, and FLS values may be used in a motor model to obtain the motor slip and the rotor resistance as a function of the slip. Further, the slip of the motor may be measured during a calibration start. The measured slip may then be used to determine a motor model that may be used to calculate the slip of a motor during subsequent motor starts.

In various embodiments, the slip-dependent motor model may be used to control the motor during startup. In one specific application, the slip-dependent motor model may be used to measure the thermal capacity used (TCU) of the motor during startup. Overheating of motors can contribute to motor failure and motor wear. Thermal stresses may degrade insulation in the motor and/or deform conductors. Although overheating may occur during operation of a motor, the risk of overheating is particularly acute during startup. Since the rotor resistance decreases as the slip goes to zero, the rotor heating also decreases and longer start times are possible in comparison to a slip-independent motor model.

The slip calculation is sensitive to errors in the settings. To avoid this problem, motor models may use slip measurements from sources independent of the motor parameters. With these other sources of slip measurements, a control system may provide secure motor protection by assuming that the rotor resistance during standstill rotor conditions is twice the rotor resistance when the slip is close to zero. This assumption, however, may be overly restrictive. In various embodiments consistent with the present disclosure, these assumptions may be refined and the maximum start time may be dependably lengthened.

In some embodiments, a field calibration start may be obtained and used to determine values used in a motor model consistent with the present disclosure. The measurements obtained during a field calibration may include slip, stator current, and stator voltage. In some embodiments, a motor model parameter may be determined using a ratio of a running rotor resistance and a standstill rotor condition resistance. The motor model parameter may be used to calculate a slip of the motor and to control the model during startup. In some embodiments, the motor model may determine the heating of the motor during startup and may compare the modeled heating to the thermal capacity of the motor to determine if a protective action (e.g., interrupting the flow of electrical current) is necessary.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special purpose processing devices such as an application specific interface circuit (ASIC), programmable array logic (PAL), programmable logic array (PLA), programmable logic device (PLD), field programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

FIG. 1 illustrates a method 100 for determining slip-dependent model values consistent with embodiments of the present disclosure. In various embodiments, commissioning data for a motor may be obtained. In the illustrated embodiment, the slip, current, and voltage are monitored during commissioning at 102. The positive sequence currents and voltages from the motor field calibration start may be used to compute the positive sequence motor resistance, $R_p$, at 104. The motor resistance may be determined by dividing the voltage by the current to determine the impedance (i.e., V/I=Z). The real value of Z, may be defined as the motor resistance, $R_p$. A low pass filter may be applied at 106 to eliminate oscillations due to rotor saliences and compute $R_{pf}$.

At 108, motor model parameters are computed. In one embodiment, the modeled slip function may be determined using Eq. 1.

$$\text{SLIP} = \frac{5}{6} * \frac{R_0}{(R_{pf} - R_S) - (R_1 - R_0)} \qquad \text{Eq. 1}$$

where $R_S$ represents the stator resistance of the motor. The values of $R_0$, $R_1$, and $R_S$ may be determined by minimizing the value of Eq. 2.

$$\sum_{k=0}^{n} \left( \frac{5}{6} * \frac{R_0}{(R_{pf}[k] - R_S) - (R_1 - R_0)} - \text{Measured Slip}[k] \right)^2 \qquad \text{Eq. 2}$$

A variety of mathematical techniques may be used to identify the values of $R_0$, $R_1$, and $R_S$ that minimize Eq. 2.

Figure 2:
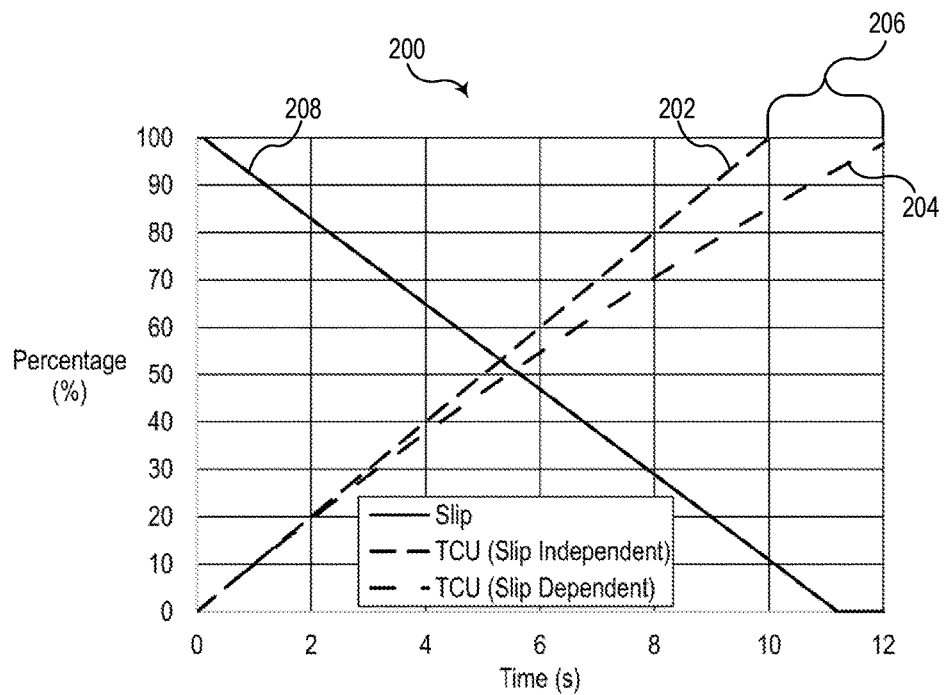
FIG. 2 illustrates a plot of a motor thermal capacity used over time according to a slip-dependent motor model and a slip-independent motor model for a motor starting in a standstill rotor condition to a synchronous speed in 11 seconds and consistent with embodiments of the present disclosure.

FIG. 2 illustrates a plot 200 of a motor thermal capacity used over time according to a slip-independent model 202 and a slip-dependent model 204 for a motor starting in a standstill rotor condition (i.e., a slip of 1) to a synchronous speed (i.e., a slip of 0) in 11 seconds and consistent with embodiments of the present disclosure. The motor slip 208 goes to zero once the rotation of the shaft is synchronized with the frequency of the supply current. The slip-independent model 202 integrates the motor starting current over time to estimate the rotor temperature. An IED may determine the slip-independent model at each processing interval and determine the rotor thermal capacity used (TCU) using Eq. 3.

$$TCU[k] = TCU[k-1] + 100 * \frac{\Delta t \sum_0^k I^2[k]}{LRA^2 * LRT} \qquad \text{Eq. 3}$$

where,
I is the motor current,
LRA is locked rotor value, and
LRT is the locked rotor time.

According to Eq. 3, if the current remains at the locked rotor current value (LRA) for the locked rotor time (LRT) the TCU reaches 100% in a short time (e.g., a matter of seconds) as defined by the LRT. The LRT value is commonly provided by a manufacturer of the motor.

Multiplying and dividing the TCU equation by the rotor resistance, $R_r$, yields Eq. 4.

$$TCU[k] = TCU[k-1] + 100 * \frac{\Delta t \sum_0^k I^2[k] * R_r}{LRA^2 * LRT * R_r} \qquad \text{Eq. 4}$$

The denominator of Eq. 3 may represent the thermal energy that the rotor may absorb before reaching a damaging temperature. The numerator is the amount of energy added to the rotor at time k.

A slip-dependent motor model may account for changes in the rotor resistance as a function of the slip, as expressed in Eq. 5. In Eq. 5, the value $R_r(S[k])$ represents a value of the rotor resistance at a plurality of times, k, while the value $R_r(1)$, represents the value of the rotor resistance following start-up and when the slip is 1 (i.e., the rotor is in a standstill condition).

$$TCU[k] = TCU[k-1] + \frac{100 * \Delta t}{LRA^2 * LRT} * \sum_0^k \frac{I^2[k] * R_r(S[k])}{R_r(1)} \qquad \text{Eq. 5}$$

The rotor resistance dependence on the slip can be expressed using Eq. 6.

$$R_r(S) = R_1 S + R_0 (1-S) \qquad \text{Eq. 6.}$$

where,
$R_1$ is the rotor resistance for the standstill rotor condition,
S is the slip, and
$R_0$ is the rotor resistance when the rotor is at synchronous speed (i.e., the slip is 0).

The resistance value, $R_1$, typically exceeds the rotor resistance, $R_0$. The slip, S, is a value between 0 and 1. Eq. 5 and Eq. 6 may be combined to yield Eq. 7.

$$TCU[k] = \\ TCU[k-1] + \frac{100 * \Delta t}{LRA^2 * LRT} * \sum_0^k \frac{I^2[k] * (R_1 S[k] + R_0(1-S[k]))}{R_1} \qquad \text{Eq. 7}$$

The ratio of $R_1 S[k] + R_0(1-S[k])$ to $R_1$ is between 1, when the slip is one and $$0 < \frac{R_0}{R_1} \le 1$$

when the slip is zero making the TCU increments smaller than in the slip-independent motor model. The smaller TCU increments lead to longer start times. The plot illustrated in FIG. 1 represents the case where $$\frac{R_0}{R_1} = \frac{2}{3}.$$

Note that as the motor slip 208 approaches zero, the slope of the slip-dependent model 204 decreases, and results in two additional seconds of start time 206.

Figure 3:
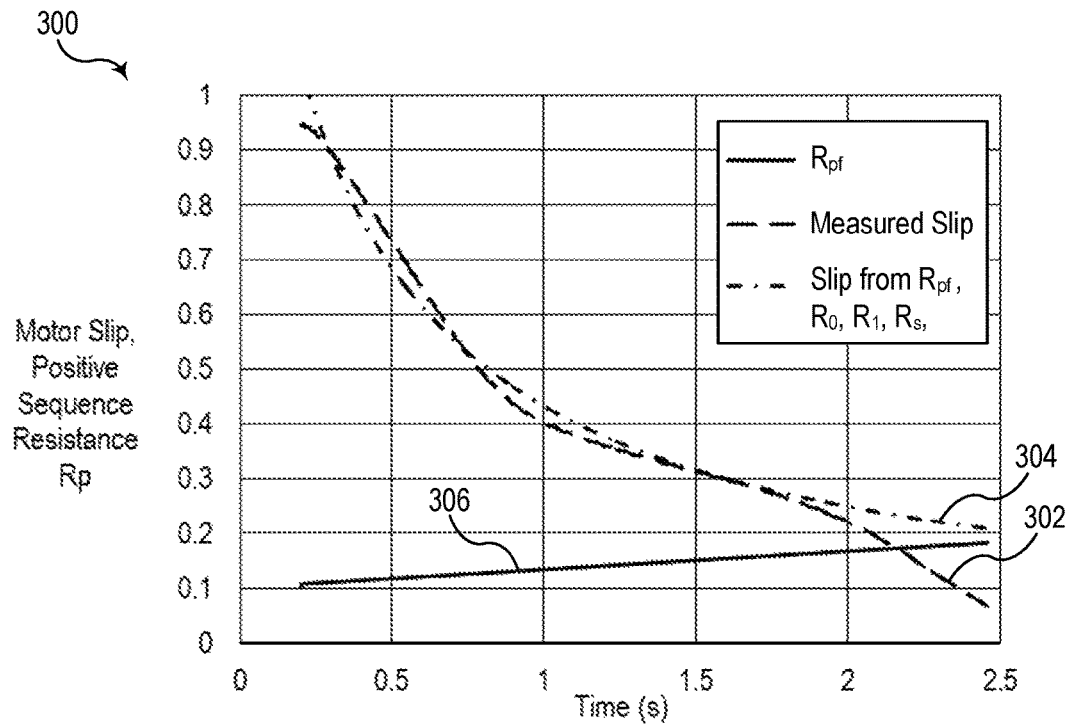
FIG. 3 illustrates a plot of a measured slip value, a modeled slip value, and a resistance, $R_{pf}$, of a synchronous motor in a calibration start condition consistent with embodiments of the present disclosure.

FIG. 3 illustrates a plot 300 of a measured slip value 302, a modeled slip value 304, and a filtered positive sequence resistance 306, $R_{pf}$, of a synchronous motor in a calibration start condition consistent with embodiments of the present disclosure. In the illustrated embodiment, the motor comprises a 5 kW motor. As shown in FIG. 3, the measured slip value 302 and the modeled slip value 304 are tightly correlated, with the modeled slip value 304 generally exceeding the actual slip value by a small margin.

As described above, parameters used by a motor model consistent with the present disclosure may be obtained during commissioning or during a calibration process. The parameters may then be used during operation of the motor to model the behavior of the motor using electrical measurements. In some embodiments, the model may be used to calculate a temperature of the motor and to maintain the temperature of the motor below a thermal threshold.

Figure 4:
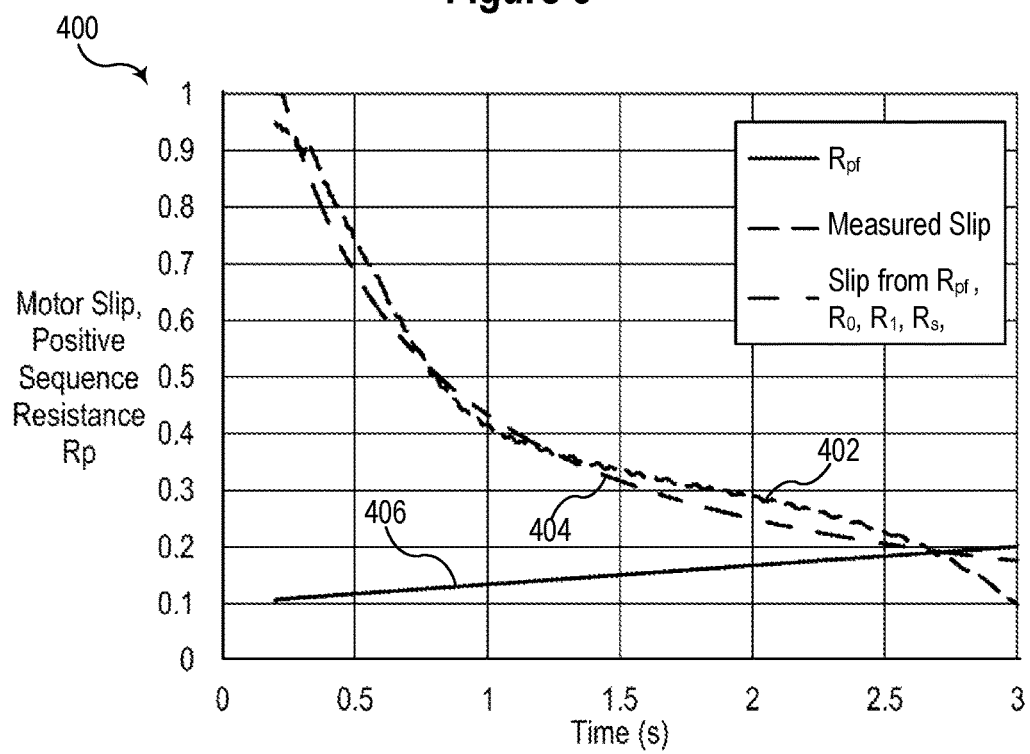
FIG. 4 illustrates a plot of a measured slip value, a modeled slip value, and a resistance of a motor in a loaded start condition consistent with embodiments of the present disclosure.

FIG. 4 illustrates a plot 400 of a measured slip value 402, a modeled slip value 404, and a measured positive sequence resistance 406 of a motor in a loaded start condition consistent with embodiments of the present disclosure. In the illustrated embodiment, the motor comprises a 5 kW motor. As shown in FIG. 4, the measured slip value 402 and the modeled slip value 404 are well correlated, with the modeled slip value 404 generally exceeding the actual slip value by a small margin. The value of the measured positive sequence resistance, $R_{pf}$, 406 is also plotted.

Figure 5:
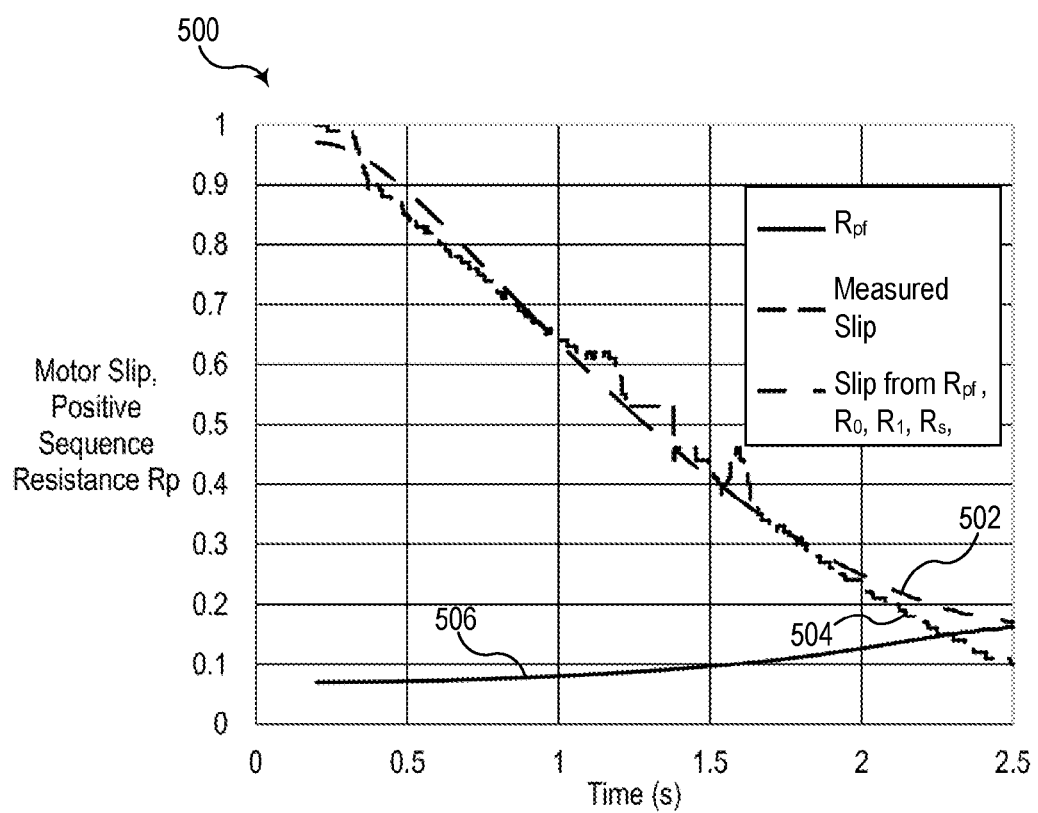
FIG. 5 illustrates a plot of power, a measured slip value, and a modeled slip value of another synchronous motor in a calibration start condition consistent with embodiments of the present disclosure.

FIG. 5 illustrates a plot 500 of a measured slip value 502, a modeled slip value 504, and a resistance 506 of another synchronous motor in a calibration start condition consistent with embodiments of the present disclosure. FIGS. 3-5 demonstrate the correlation of the modeled slip values and measured slip values under various conditions. The correlation between the modeled and measured slip values establishes the reliability of the models set forth herein and the suitability of such models for motor protection applications.

Figure 6A:
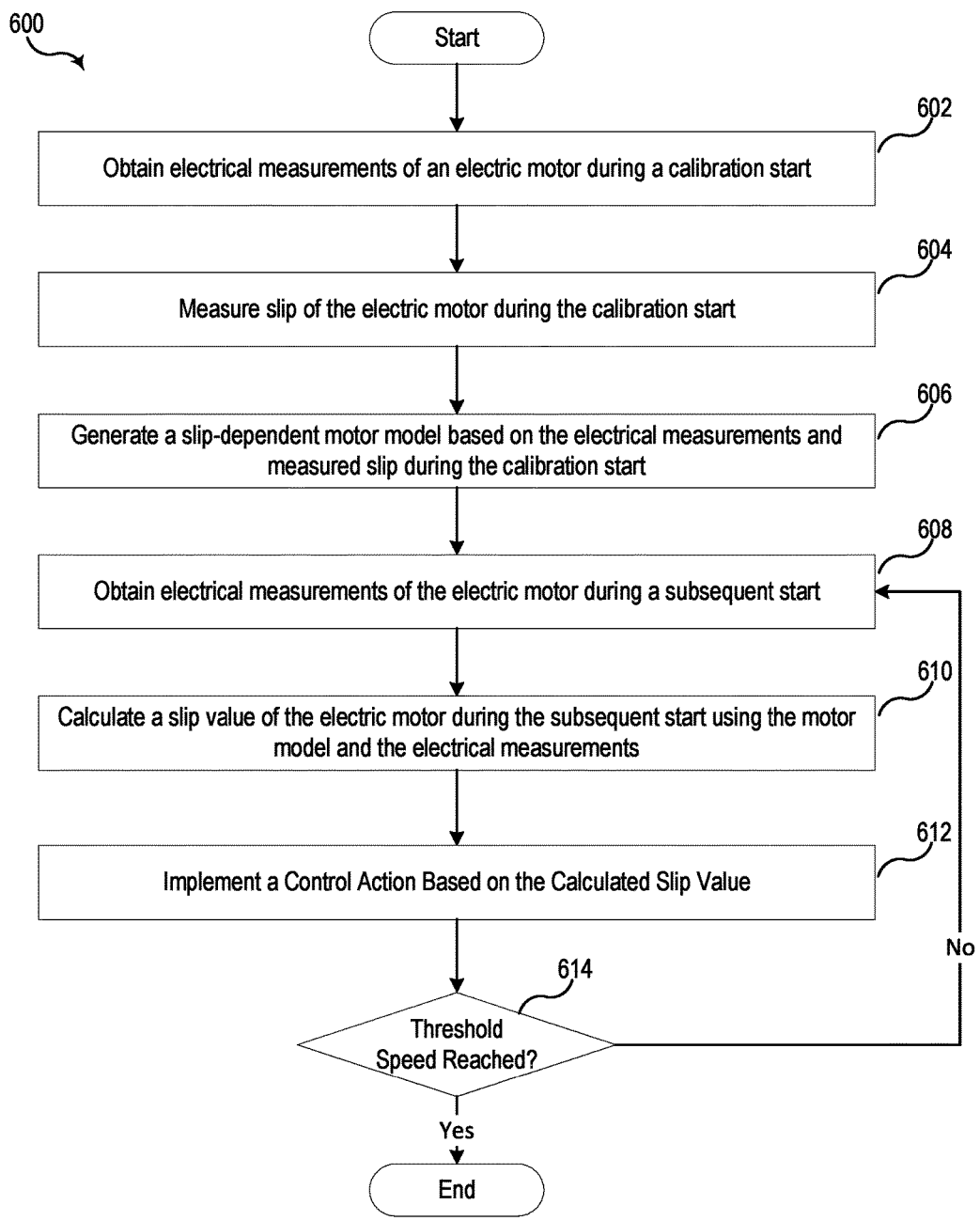
FIG. 6A illustrates a flow chart of a method for developing a slip-dependent motor model and controlling a motor using the slip-dependent motor model based on electrical measurements consistent with embodiments of the present disclosure.

FIG. 6A illustrates a flow chart of a method 600 for developing a slip-dependent motor model and controlling a motor using the slip-dependent motor model based on electrical measurements consistent with embodiments of the present disclosure. At 602, electrical measurements of an electric motor may be obtained during a calibration start. In various embodiments, the electrical measurements may comprise the current drawn by the motor during startup. In other embodiments, the other electrical measurements may also be monitored, such as voltage, frequency, etc. The calibration start may be performed during commissioning of the motor and/or at various points following commissioning.

At 604, the slip of the electric motor may be measured during the calibration start. In various embodiments, a rotational sensor may be coupled to the shaft and compared to the frequency of the current driving the motor. When the rotor is in a standstill condition, the slip is equal to 100%. The slip may decline as the motor accelerates until the speed reaches a steady-state value.

At 606, a motor model may be generated based on the electrical measurements and the measured slip during the calibration start. In various embodiments, the slip-dependent motor model may be generated using Eqs. 1-7 and as described above. In various embodiments, electrical measurements and slip may be made over a span of time, and the parameters of the motor model may comprise a plurality of values.

At 608 electrical measurements of the electric motor may be measured during a subsequent start. In various embodiments, the electrical measurements may comprise the current drawn by the motor during startup. In other embodiments, the other electrical measurements may also be monitored, such as voltage, frequency, etc.

At 610, a slip value of the electric motor during the subsequent start may be calculated using the motor model and the electrical measurements. In various embodiments, the slip value may be calculated at a plurality of points in time.

At 612, method 600 may implement a control action based on the calculated slip. The control action may comprise a protective action, such as interrupting the flow of current to the motor. Where the motor model predicts operation within acceptable parameters, the control action may consist of continuing a motor startup.

At 614, method 600 may determine whether a speed threshold has been reached. The motor slip may decline as the motor accelerates until the speed reaches a steady-state value. In various embodiments, the threshold may be established based on the steady state value. In the case of a synchronous motor, the steady-state value may be established by the frequency of the current driving the motor. In the case of an asynchronous motor, the speed threshold may represent a steady-state slip value based on the motor. The determination of whether the threshold speed has been reached may be made based on a calculation of the slip using, for example, Eq. 5. Method 600 may return to 608 if the speed threshold has not been reached.

Figure 6B:
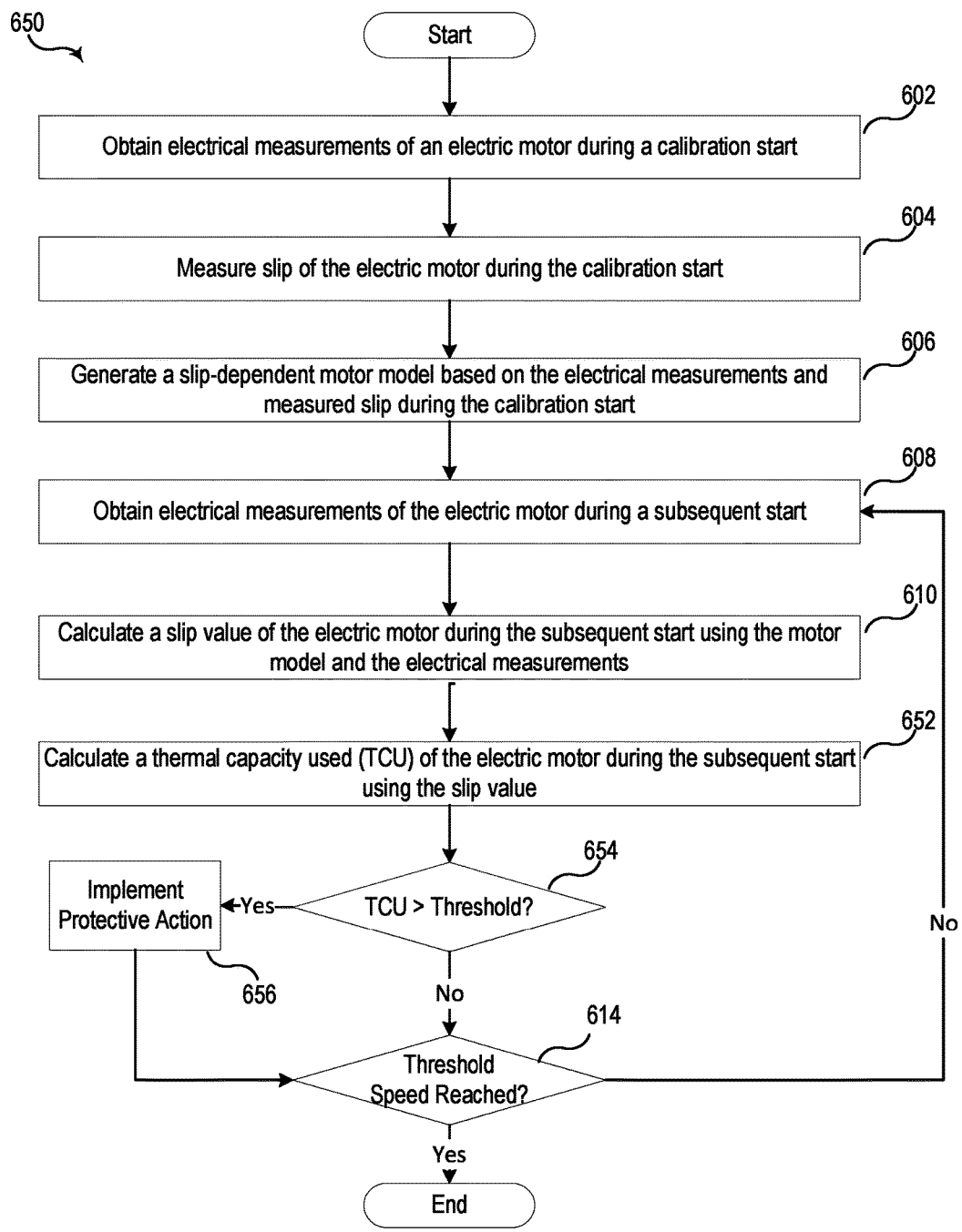
FIG. 6B illustrates a flow chart of a method for developing the slip-dependent motor model illustrated in FIG. 6A in connection with a thermal protection scheme consistent with embodiments of the present disclosure.

FIG. 6B illustrates a flow chart of a method 650 of the slip-dependent motor model illustrated in FIG. 6A in connection with a thermal protection scheme consistent with embodiments of the present disclosure. Method 650 follows method 600 until 652. In the interest of brevity, the elements common to method 600 and method 650 are described only in connection with method 600.

At 652, a TCU of the electric motor may be determined using the motor model, the measured slip value, and the electrical measurements. As described above, the determination of the slip may be used to determine the TCU of the motor, rather than relying on a slip-invariant motor model.

At 654, method 650 may determine whether the TCU is greater than a threshold. In some embodiments, the threshold may be equal to 100%. In other embodiments, the threshold may be less than 100% to provide a safety margin or to account for other circumstances. In the event that the TCU exceeds the threshold, method 650 may implement a protective action at 656 and return to 608. Otherwise, method 650 may proceed to 614.

Figure 6C:
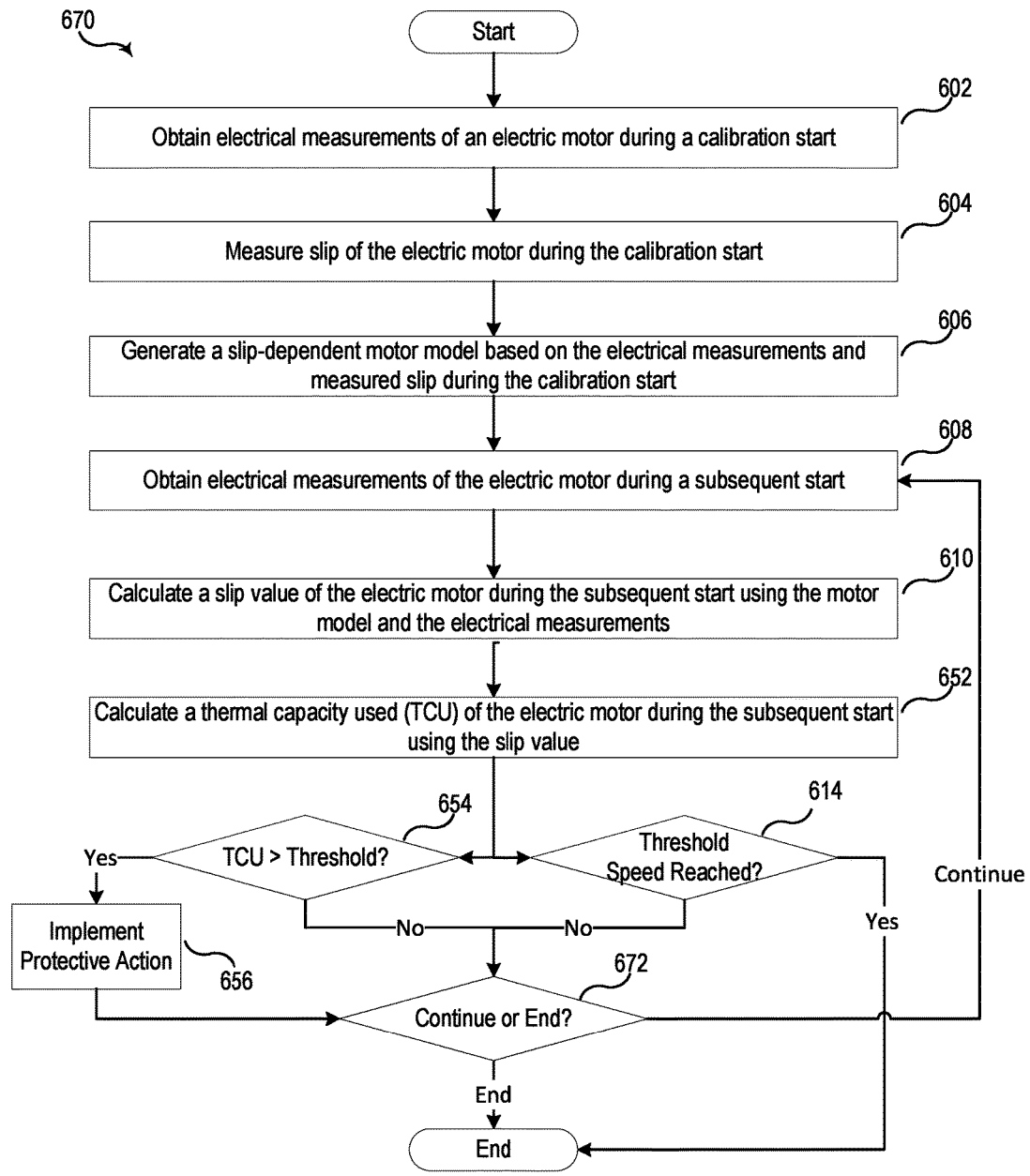
FIG. 6C illustrates a flow chart of a method of using slip-dependent motor model illustrated in FIG. 6B, in which the thermal threshold and the speed threshold operate in parallel consistent with embodiments of the present disclosure.

FIG. 6C illustrates a flow chart of a method 670 of the slip-dependent motor model illustrated in FIG. 6B in which the thermal threshold and the speed threshold operate in parallel consistent with embodiments of the present disclosure. The elements common to method 600, method 650, and method 670 are described only in connection with method 600. At 672, method 650 may determine based on any or all of the protective action, the thermal threshold, and the speed threshold whether to continue or to end. In various embodiments, method 670 may continue following certain protective actions and/or conditions and may end in response to other conditions. For example, in some instances, method 670 may determine that the TCU is greater than the threshold on one attempt, may implement a protective action, and may attempt to start the motor again after a specified period of time has passed. In some embodiments, method 670 may compute the slip from the standstill rotor condition until the motor reaches nominal speed regardless of the TCU value.

Figure 7:
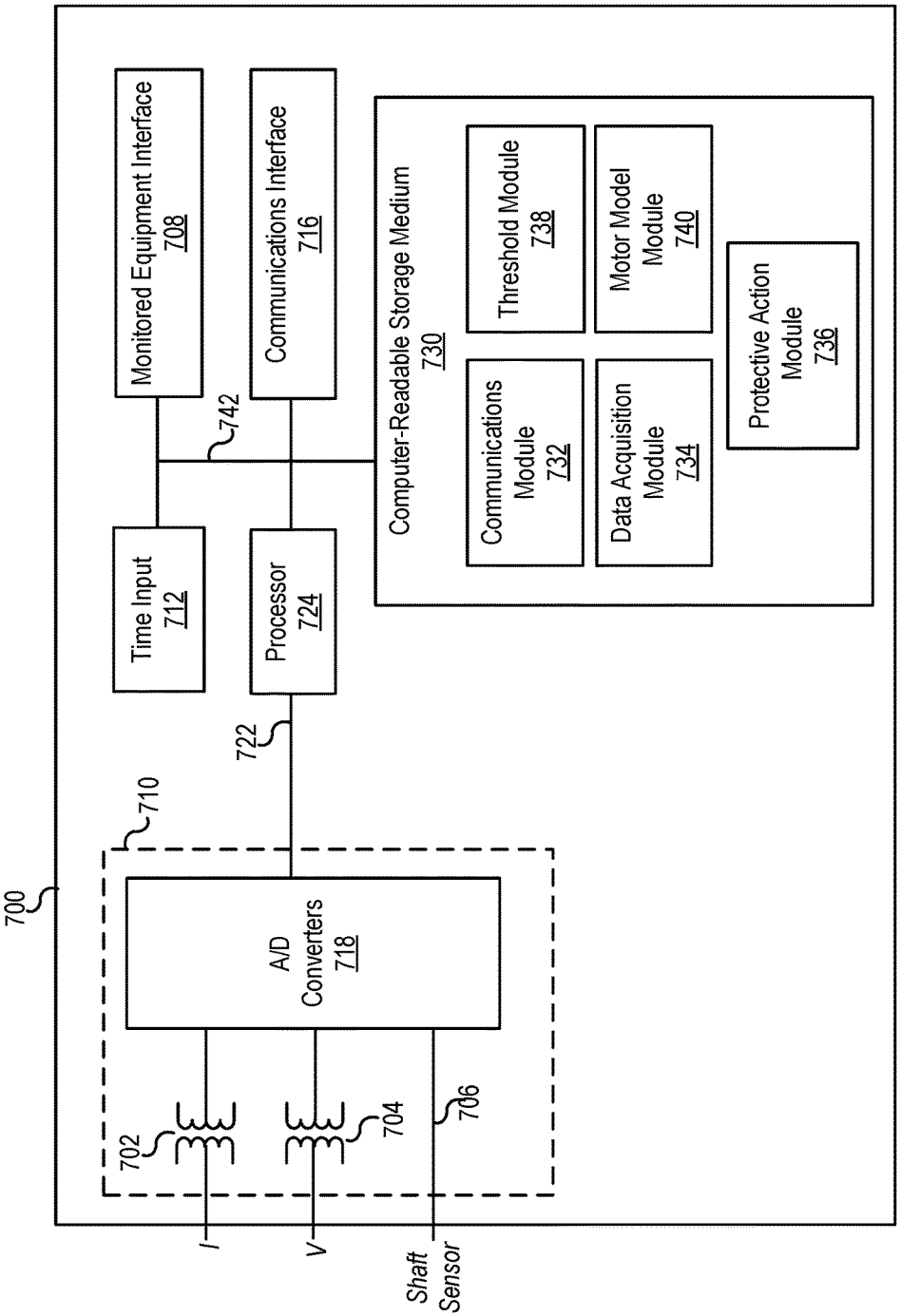
FIG. 7 illustrates a functional block diagram of a system configured to control a motor using a slip-dependent motor model consistent with embodiments of the present disclosure.

FIG. 7 illustrates a functional block diagram of a system 700 configured to control a motor using a slip-dependent motor model consistent with embodiments of the present disclosure. In certain embodiments, system 700 may comprise an IED system configured to, among other things, monitor and protect a motor. System 700 may be implemented using hardware, software, firmware, and/or any combination thereof. In some embodiments, system 700 may be embodied as an IED, while in other embodiments, certain components or functions described herein may be associated with other devices or performed by other devices. The specifically illustrated configuration is merely representative of one embodiment consistent with the present disclosure.

System 700 includes a communications interface 716 configured to communicate with devices and/or IEDs. In certain embodiments, the communications interface 716 may facilitate direct communication with IEDs or other systems, or may enable communication with systems over a communications network. Communications interface 716 may facilitate communications through networks using a variety of communications technologies.

System 700 may further include a time input 712, which may be used to receive a time signal (e.g., a common time reference) allowing system 700 to apply a time-stamp to the acquired samples. In certain embodiments, a common time reference may be received via communications interface 716, and accordingly, a separate time input may not be required for time-stamping and/or synchronization operations. One such embodiment may employ the IEEE 1588 protocol. A monitored equipment interface 708 may be configured to receive status information from, and issue control instructions to, a piece of monitored equipment (such as a circuit breaker, conductor, transformer, or the like).

Processor 724 may be configured to process communications received via communications interface 716, time input 712, and/or monitored equipment interface 708. Processor 724 may operate using any number of processing rates and architectures. Processor 724 may be configured to perform various algorithms and calculations described herein. Processor 724 may be embodied as a general purpose integrated circuit, an application specific integrated circuit, a field-programmable gate array, and/or any other suitable programmable logic device.

In certain embodiments, system 700 may include a sensor component 710. In the illustrated embodiment, sensor component 710 comprises an electrical measurement input configured to gather data relating to an electrical condition directly from conventional electric power system equipment such as a conductor (not shown) using conventional PTs and/or CTs. The sensor component 710 may use, for example, transformers 702 and 704 and A/D converters 718 that may sample and/or digitize filtered waveforms to form corresponding digitized current and voltage signals provided to data bus 722. Current (I) and voltage (V) inputs may be secondary inputs from conventional instrument transformers such as, CTs and VTs. A/D converters 718 may include a single A/D converter or separate A/D converters for each incoming signal. A current signal may include separate current signals from each phase of a three-phase electric power system. A/D converters 718 may be connected to processor 724 by way of data bus 722, through which digitized representations of current and voltage signals may be transmitted to processor 724.

Sensor component 710 may further be configured to interface with a shaft sensor 706 configured to monitor slip of a motor. In some embodiments, the shaft sensor 706 may comprise a shaft mounted sensor coupled to the motor. In various embodiments, the rotation of the shaft may be compared to the frequency of the current to determine the slip. In other embodiments, information regarding motor slip may be acquired through other interfaces, including the monitored equipment interface 708 and/or the communications interface 716.

A computer-readable storage medium 730 may be the repository of various software modules configured to perform any of the methods described herein. A data bus 742 may link monitored equipment interface 708, time input 712, communications interface 716, and computer-readable storage medium 730 to processor 724.

Communications module 732 may be configured to allow system 700 to communicate with any of a variety of external devices via communications interface 716. Communications module 732 may be configured for communication using a variety of data communication protocols (e.g., UDP over Ethernet, IEC 61850, etc.). Communications module 732 may be configured to determine the latency information regarding information received through communications interface 716.

Data acquisition module 734 may collect data samples associated with a motor during a calibration start or during a subsequent start. In various embodiments, the data may comprise current and voltage measurements and/or slip measurements associate with a rotor. In various embodiments, a rotational sensor may be configured to interface with the monitored equipment interface 708 or another component of system 700.

A protective action module 736 may be configured to implement a protective action based on a motor model. In various embodiments, the protective action module 736 may be configured to interrupt the flow of electrical current to the motor. In one specific embodiment, the protective action module 736 may be configured to determine whether the motor TCU exceeds a threshold.

A threshold module 738 may be configured to establish various thresholds associated with a motor model. In various embodiments, the threshold module 738 may be configured to establish a thermal threshold. The thermal threshold may be selected to ensure that a motor does not suffer damage from excessive thermal energy. Still further, the threshold module 738 may be configured to establish a speed threshold that may be used to determine a startup period associated with the motor.

A motor model module 740 may be configured to generate a motor model based on the electrical measurements and measured slip during the calibration start. In various embodiments, the motor model may be generated using Eqs. 1-7, and as described above. In some embodiments, the motor model may be configured to determine thermal parameters of the motor based on electrical measurements and a calculated slip value. In various embodiments, electrical measurements and slip may be made over a span of time, and the parameters of the thermal model may comprise a plurality of values.

What is claimed is:

1. A system configured to generate a slip-dependent motor model to monitor and protect an electric motor during a motor start, comprising:
   an electrical measurement input to monitor at least one electrical condition of electrical energy supplied to the electric motor;
   a slip input configured to monitor a measured slip of the electric motor;
   a processor in communication with the electrical measurement input and the slip input and configured to:
      generate a motor model based on the at least one electrical condition and the measured slip during a calibration motor start;
      measure the at least one electrical condition of the motor during a subsequent motor start;
      determine a calculated slip of the motor during the subsequent start based on the at least one electrical condition and the motor model; and,
      implement a control action based on the calculated slip and the motor model;
   wherein the motor model comprises a representation of a standstill rotor condition resistance, a rotor resistance at synchronous speed, and a stator resistance.

2. The system of claim 1, wherein the electric motor comprises a synchronous motor.

3. The system of claim 1, wherein the at least one measured electrical condition comprises one of an electric current, and an electric voltage.

4. The system of claim 1, wherein the processor is further configured to:
   calculate a thermal capacity used (TCU) of the electric motor during the subsequent start using the thermal model and the at least one measured electrical condition;
   compare the TCU to a threshold; and
   determine that the TCU exceeds the threshold;
   wherein the protective action comprises interrupting the flow of electrical energy supplied to the motor.

5. The system of claim 4, wherein the processor is further programmed to determine the TCU using the calculated slip.

6. The system of claim 1, wherein the at least one measured electrical condition comprises an electric current and the motor model is further configured to determine a calculated slip during the subsequent start based on the electric current.

7. The system of claim 1, wherein the processor is further configured to determine a ratio of running rotor resistance to a standstill rotor condition resistance and wherein the motor model is at least partially based on the ratio.

8. The system of claim 1, further comprising a shaft-mounted sensor in communication with the slip input.

9. The system of claim 1, wherein the representations of the standstill rotor condition resistance, the rotor resistance at synchronous speed, and the stator resistance are determined by minimizing a difference between a modeled slip function and the measured slip.

10. A method for generating a slip-dependent motor model for monitoring and protecting an electric motor during a motor start, comprising:
   monitoring at least one measured electrical condition of electrical energy supplied to the electric motor;
   monitoring a measured slip of the electric motor;
   generating a motor model based on the at least one measured electrical condition and the measured slip during a calibration motor start, the motor model comprising a representation of a standstill rotor condition resistance, a rotor resistance at synchronous speed, and a stator resistance;
   measuring the at least one electrical condition during a subsequent motor start;
   implementing a control action based on the calculated slip and the motor model.

11. The method of claim 10, wherein the electric motor comprises a synchronous motor.

12. The method of claim 10, wherein the at least one measured electrical condition comprises one of an electric current, an electric voltage, and a frequency.

13. The method of claim 10, further comprising:
   calculating a thermal capacity used (TCU) of the electric motor during the subsequent start using the motor model and the at least one measured electrical condition of electrical energy;
   comparing the TCU to a threshold;
   determining that the TCU exceeds the threshold.

14. The method of claim 10, further comprising determining a calculated slip during the subsequent start based on the at least one electrical condition of electrical energy.

15. The method of claim 10, wherein the at least one measured electrical condition comprises an electric current and calculating a slip during the subsequent start based on the electric current.

16. The method of claim 10, further comprising determining a ratio of running rotor resistance to a standstill rotor condition resistance and wherein the motor model is at least partially based on the ratio.

17. The method of claim 10, wherein the threshold accounts for motor losses following the subsequent start.

18. The method of claim 10, further comprising minimizing a difference between a modeled slip function and the measured slip to determine the representations of the standstill rotor condition resistance, the rotor resistance at synchronous speed, and the stator resistance.

19. A system configured to generate a slip-dependent motor model to monitor and protect an electric motor during a motor start, comprising:
   an electrical measurement input to monitor at least one electrical condition of electrical energy supplied to the electric motor, the electrical condition comprising an electric current;
   a slip input configured to monitor a measured slip of the electric motor;
   a processor in communication with the electrical measurement input and the slip input and configured to:
      generate a motor model based on the at least one electrical condition and the measured slip during a calibration motor start;
      measure the at least one electrical condition of the motor during a subsequent motor start;
      determine a calculated slip of the motor during the subsequent start based on the at least one electrical condition and the motor model, wherein the electrical condition comprises an electric current; and,
      implement a control action based on the calculated slip and the motor model.

20. A system configured to generate a slip-dependent motor model to monitor and protect an electric motor during a motor start, comprising:
   an electrical measurement input to monitor at least one electrical condition of electrical energy supplied to the electric motor;
   a slip input configured to monitor a measured slip of the electric motor;
   a processor in communication with the electrical measurement input and the slip input and configured to:
      determine a ratio of running rotor resistance to a standstill rotor resistance using the measured slip;
      generate a motor model based on the at least one electrical condition and the ratio during a calibration motor start;
      measure the at least one electrical condition of the motor during a subsequent motor start;
      determine a calculated slip of the motor during the subsequent start based on the at least on electrical condition and the motor model; and,
      implement a control action based on the calculated slip and the motor model.

* * * * *